(12) United States Patent
Rupp et al.

(10) Patent No.: US 9,725,054 B2
(45) Date of Patent: Aug. 8, 2017

(54) METHOD FOR MONITORING A COMPONENT IN A MOTOR VEHICLE

(71) Applicant: Robert Bosch GmbH, Stuttgart (DE)

(72) Inventors: Thomas Rupp, Benningen am Neckar (DE); Stefan Cermak, Vienna (AT); Jens Werneth, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/915,835

(22) PCT Filed: Aug. 29, 2014

(86) PCT No.: PCT/EP2014/068323
§ 371 (c)(1),
(2) Date: Mar. 1, 2016

(87) PCT Pub. No.: WO2015/028581
PCT Pub. Date: Mar. 5, 2015

(65) Prior Publication Data
US 2016/0193973 A1    Jul. 7, 2016

(30) Foreign Application Priority Data

Sep. 2, 2013  (DE) ........................ 10 2013 217 461

(51) Int. Cl.
*B60R 16/03* (2006.01)
*B60L 3/00* (2006.01)
(Continued)

(52) U.S. Cl.
CPC ............ *B60R 16/03* (2013.01); *B60L 3/0084* (2013.01); *B60L 3/0092* (2013.01); *B60L 3/04* (2013.01);
(Continued)

(58) Field of Classification Search
CPC ... B60R 16/03; B60R 16/0315; B60L 3/0084; B60L 3/0092; B60L 3/04; B60L 11/18;
(Continued)

(56) References Cited

U.S. PATENT DOCUMENTS 5,548,601 A    8/1996  Kato et al.
2008/0140279 A1  6/2008  Geyer et al.
(Continued)

FOREIGN PATENT DOCUMENTS

CN    101417637 A    4/2009
CN    201619539 U    11/2010
(Continued)

OTHER PUBLICATIONS

International Search Report for Application No. PCT/EP2014/068323 dated Nov. 18, 2014 (English Translation, 3 (pages).

*Primary Examiner* — Marc McDieunel
*Assistant Examiner* — James E Stroud
(74) *Attorney, Agent, or Firm* — Michael Best & Friedrich LLP

(57) ABSTRACT

The invention relates to a method for monitoring a component (12), in particular a battery, of a motor vehicle having a first control unit (14) for monitoring the component (12) and a second control unit (16) for monitoring the component (12), wherein the second control unit (16) is arranged at a distance from the first control unit (14) and communicates with the first control unit (14), wherein the second control unit (16) is connected to the component (12) via a line (20), in particular a hardware line, comprising the steps of transmitting operating data to the first control unit (14) by means of the second control unit (16), checking the operating data in the first control unit (14), transmitting data from the first control unit (14) to the second control unit (16), switching off the component (12) by means of the second control unit
(Continued)

(16) if interference is detected by means of the first control unit (14) and/or the second control unit (16). The invention makes possible spatial separation of the control unit to be tested from the control unit carrying out the switching off, wherein the installation position of the control unit to be tested can be selected freely.

20 Claims, 3 Drawing Sheets

(51) Int. Cl.
*B60L 3/04* (2006.01)
*B60L 11/18* (2006.01)
*G06F 1/28* (2006.01)
*G06F 11/07* (2006.01)
*H01M 10/48* (2006.01)
*G08C 17/00* (2006.01)
*H04Q 9/00* (2006.01)
*H01M 10/42* (2006.01)
*G01R 31/36* (2006.01)

(52) U.S. Cl.
CPC .......... *B60L 11/18* (2013.01); *B60L 11/1816* (2013.01); *G06F 1/28* (2013.01); *G06F 11/0739* (2013.01); *G06F 11/0751* (2013.01); *G08C 17/00* (2013.01); *H01M 10/48* (2013.01); *H04Q 9/00* (2013.01); *B60R 16/0315* (2013.01); *G01R 31/3648* (2013.01); *H01M 10/425* (2013.01); *H01M 2220/20* (2013.01); *H04Q 2209/30* (2013.01); *Y02T 10/7005* (2013.01); *Y02T 10/7072* (2013.01); *Y02T 90/14* (2013.01); *Y02T 90/16* (2013.01)

(58) Field of Classification Search
CPC .... B60L 11/1816; G06F 1/28; G06F 11/0739; G06F 11/0751; G08C 17/00; H01M 10/48; H01M 10/425; H01M 2220/20; H04Q 9/00; H04Q 2209/30; G01R 31/3648; Y02T 10/7005; Y02T 10/7072; Y02T 90/14; Y02T 90/16
USPC ........................................................ 701/29.2
See application file for complete search history.

(56) References Cited

U.S. PATENT DOCUMENTS

| 2012/0062158 A1* | 3/2012 | Itou ..................... H02P 23/0077 318/400.21 |
| 2013/0346783 A1 | 12/2013 | Weber et al. |
| 2014/0149809 A1 | 5/2014 | Bisht et al. |
| 2016/0004535 A1* | 1/2016 | Robertson ........... G06F 9/30185 712/205 |

FOREIGN PATENT DOCUMENTS

| CN | 102189995 A | 9/2011 |
| DE | 10238547 | 3/2004 |
| DE | 102005003916 | 8/2006 |
| DE | 102010031456 | 1/2012 |
| DE | 102010038886 | 2/2012 |
| DE | 102010041003 | 3/2012 |
| DE | 102010041492 | 3/2012 |
| DE | 102011082937 | 3/2013 |
| EP | 1002699 | 5/2000 |
| JP | 2010244311 | 10/2010 |

* cited by examiner

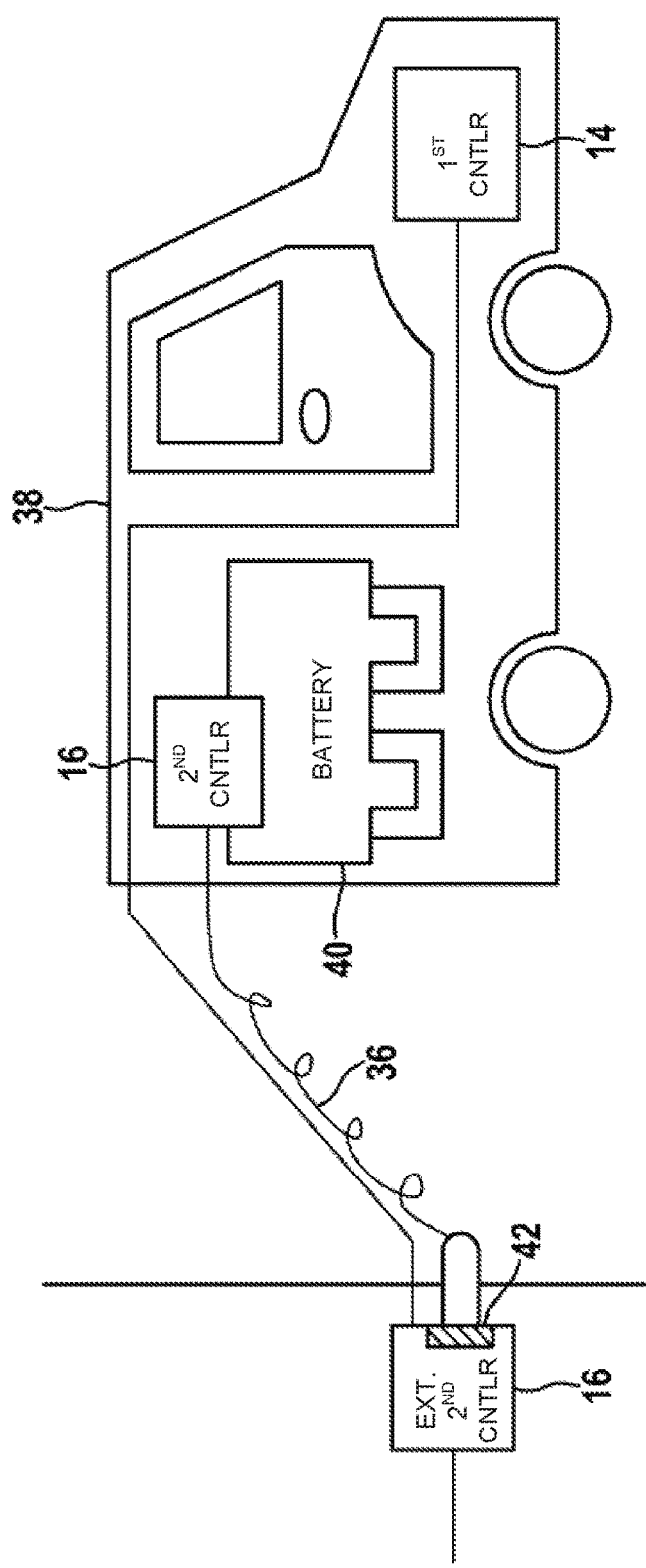

METHOD FOR MONITORING A COMPONENT IN A MOTOR VEHICLE

BACKGROUND OF THE INVENTION

The present invention relates to a method for monitoring a component, in particular a battery, of a motor vehicle, an arrangement for monitoring a component, a component which is monitored by means of the method, and a motor vehicle.

In a majority of safety-relevant systems, for example, an engine control unit or a battery control unit, the computer unit to be checked, the monitoring module, and the actuator to be switched off are located directly in the same control unit. The further removed the control device is, the more cost-intensive the hardware line, for example, the cable assembly, is for connecting the control device to the component. The best use possible is made of the available installation space in the overall complex of a passenger vehicle. The subsystems are becoming more and more extensive, and so more distance between the computer unit and the actuator will need to be bridged in the future.

SUMMARY OF THE INVENTION

The object of the present invention is a method for monitoring a component, in particular a battery or a motor vehicle motor, of a motor vehicle.

The invention relates to a method for monitoring a component, in particular a battery, of a motor vehicle having a first control unit for monitoring the component and a second control unit for monitoring the component, wherein the second control unit is disposed at a distance from the first control unit and communicates with the first control unit, wherein the second control unit is connected to the component via a line, in particular a hardware line, including the following steps: transmitting operating data to the first control unit by the second control unit, checking the operating data in the first control unit, transmitting data from the first control unit to the second control unit, switching off the component by means of the second control unit if interference is detected by the first control unit and/or the second control unit.

In particular, the first control unit of the component can be the control unit to be checked, for example, a battery control unit (BCU) or an engine control unit, and the second control unit of the component can be the control unit carrying out the switchoff, for example, a cell supervision circuit (CSC). The developmental complexity can be reduced by the possible separation of the control unit to be checked from the control unit carrying out the switchoff. It is no longer necessary to place the control unit to be checked directly next to the component. The installation position of the control unit to be checked can be freely selected, which allows for more flexible, simple, and better flexibility in designing an electronic system in a motor vehicle.

Preferably, a randomly generated question of the second control unit can be contained in the operating data to be transmitted. In this manner it can be ensured that the component can be monitored by the first control unit and that monitoring can be carried out to ensure that the component functions properly. Particularly preferably, the first control unit and/or the second control unit can comprise a watchdog (also referred to as WDC for watchdog counter). A watchdog has the function of monitoring the component of the motor vehicle. For example, the monitoring of the component can be carried out by the second control unit by means of the received data of the first control unit. In this connection, the watchdog in the second control unit can send a randomly generated question to the first control unit along with the transmitted operating data. The first control unit can receive the question and transmit a response to the second control unit via the data transmitted to the second control unit. After receiving the transmitted response to the question, the second control unit can check the received answer with respect to the transmitted question. The watchdog can therefore detect a possible malfunction. In addition, it is preferred if only the first control unit knows the correct answer to the question. The second control unit cannot be capable of generating correct responses on its own. In this manner, the correctness of the responses can be guaranteed. Furthermore, the first control unit itself can also comprise a watchdog which carries out a question-response check internally in the first control unit. As a result, the first control unit itself can be checked for correct functionality.

In addition, the second control unit can switch off the component via the line, for example, the second control unit can transmit a control voltage to the component, so that the component can be used in the motor vehicle, as soon as the first control unit and/or the second control unit detects an interference. For example, the interference can be triggered by a response to the question of the watchdog of the first control unit and/or the second control unit which is incomplete, incorrect, too late, or absent altogether. For example, a communication interruption between the first control unit and the second control unit can be triggered as a result, which can be caused, for example, by the watchdog of the first control unit and/or of the second control unit, whereby a question-response communication between the first control unit and the second control unit can be disrupted. In this manner, the component can be brought into a safe state at any time in the event of an interference. In this case, the concept of switching off or a switchoff means that the component is digitally separated from the motor vehicle, in that, for example, the second control unit removes a control voltage in the line to the component. As a result, the component can no longer be used by the motor vehicle.

Preferably, the first control unit and the second control unit are connected to one another via a field bus, in particular via CAN or FlexRay. The installation space in a motor vehicle can be optimally utilized by using a first control unit and a second control unit, wherein the first control unit is disposed at a distance from the second control unit. It is no longer necessary to place the first and the second control unit in the vicinity of the component. In addition, a cost-intensive line, in particular a hardware line, can be omitted, in that the second control unit, which switches off a component, is disposed in the direct vicinity of the component, while the first control unit can be placed at any point in the motor vehicle. In addition, the communication between the first control unit and the control unit can also take place via an existing network, for example, via Ethernet, WLan or Bluetooth. As a result, cost-intensive hardware lines can be omitted, and the first control unit can be disposed anywhere in the vehicle.

In a preferred embodiment, the first control unit has a safety classification of ASIL-X and the second control unit has a safety classification of QM. In this manner, the developmental complexity for the second control unit, which switches off the component, can be simplified. In addition, a lower-cost processor can be used in the second control unit. In this case, the term ASIL stands for "Automotive Safety Integrity Level", and is a measure of the safety-relevance of a malfunction, for example, an unwanted increase in torque in the case of an engine control unit, according to the Standard ISO 26262. The letter X in this case designates the classification of the ASIL on a scale of A to D, wherein A is the lowest and D is the highest safety classification. The safety classification QM in this case designates non-safety-relevant systems. The requirements of ISO 26262 must be implemented depending on the ASIL that is determined.

In another preferred embodiment, the first control unit has a safety classification of ASIL-X and the second control unit has a safety classification of ASIL-X. As a result, the safety-relevant hardware line can be shortened in that the switchoff message is sent to the second control unit via the FlexBus. The safety-relevant line can be implemented in hardware starting with the second control unit.

In particular, the component comprises an actuator for communication and for switching off the component, wherein the actuator is connected to the second control unit and the actuator is switched off by the second control unit as soon as a safety-critical situation is detected, whereby the component is also switched off. The use of an actuator makes it possible to omit a safety-relevant actuator mechanism in the second control unit, whereby the design of the second control unit can be simplified.

Preferably, the second control unit transmits the operating data to the first control unit within a predetermined time. By means of the transmission within a predetermined time, it can be ensured that the first control unit handles its safety-relevant processes in a stable and error-free manner, in the correct sequence, and in a correct temporal cycle. For example, the second control unit can comprise a watchdog and the watchdog can request a response from the first control unit to a randomly generated question at regular intervals. For example, a correct response to a question can be requested once every 100 ms, preferably once every 90 ms, in particular once every 80 ms.

In addition, the watchdog in the first control unit can request a response to a question from the first control unit within a predetermined time. By means of the transmission of the response within a predetermined time, it can be ensured that the first control unit handles its safety-relevant processes in a stable and error-free manner, in the correct sequence, and in a correct temporal cycle. For example, the watchdog of the first control unit can request a response to a randomly generated question from the first control unit at regular intervals. For example, a correct response to a question can be requested once every 100 ms, preferably once every 90 ms, in particularly once every 80 ms.

In one preferred embodiment, the first control unit comprises a first computer unit and a first monitoring module, and the second control unit comprises a second computer unit and a second monitoring module, wherein, via the second computer unit, a secured line to the first computer unit is established via the field bus in order to connect the first computer unit to the second monitoring module. The second monitoring module can have the task of establishing a secure switchoff path via a field bus system for the question-response communication. The second monitoring module of the second control unit can connect itself via the second computer unit to the first computer unit via the field bus and, in this manner, provide a secured digital line. The secure coupling to the first computer unit via the second computer unit can be advantageous for the application of the second monitoring module as a secured remote switch. The first computer unit and the second computer unit can each be responsible for the functionality of the component. In this connection, the first computer unit can contain the complete logic for monitoring the component. The monitoring of the component can be carried out in such a way that the first monitoring module and the second monitoring module communicate with the first computer unit. The second computer unit can be responsible for implementing the commands of the first computer unit to the second monitoring module. In addition, the second computer unit can forward the operating data of the second monitoring module to the first computer unit. In particular, the first monitoring module and/or the second monitoring module can comprise the watchdog. The second monitoring module can thereby ensure that the communication between the first computer unit and the second computer unit can function without error and that the component is switched off via the actuator in the event of an interference. Protection of all protocols and data in the first computer unit and in the second computer unit can be simplified in this manner. In the event of an interference, the second monitoring module can take over the protection of the communication.

Preferably, the second computer unit can receive the data multiple times from the first computer unit before the data are transmitted to the second monitoring module. For example, the second monitoring module can request a response to a randomly generated question from the first computer unit once every 80 ms. The first computer unit can transmit the data to the second computer unit with the response to the question from the second monitoring module within a defined time window of 20 ms, preferably 15 ms, in particular 5 ms. As a result, the second computer unit can receive the data with the response to the question multiple times before the second computer unit forwards the data to the second monitoring module. Independence from the field bus transmission can be achieved as a result. For example, briefly occurring interruptions in the field bus can be bridged, whereby the security of error-free and interruption-free monitoring can be ensured.

In addition, the first monitoring module can request a response from the first computer unit to a randomly generated question from the first computer unit, for example, once every 80 ms. In this manner, an error-free function of the first computer unit can be ensured.

In particular, the second monitoring module comprises a counting register which is incremented when erroneous data of the first computer unit are transmitted. For example, the first computer unit can transmit an erroneous response, an incorrect response, an incomplete response, a response which is too late, or no response to the second monitoring module. The present counter reading can always be transmitted by the second computer unit to the first computer unit together with the operating data via the field bus. In addition, in the case of a correct response, the counter reading can be decremented again, down to a counter reading of 0.

In one preferred embodiment, the first monitoring module can comprise a counting register which is incremented in the case of an erroneous response of the first computer unit to the question of the first monitoring module. An erroneous response can be, for example, an incorrect response, an incomplete response, a response which is too late, or the absence of a transmission of a response. The present counter reading can always be transmitted by the first monitoring module to the first computer unit together with the question. In addition, in the case of a correct response, the counter reading can be decremented again, down to a counter reading of 0.

Preferably, the first computer unit deliberately transmits incorrect data to the first monitoring module and/or to the second monitoring module. The first control unit can deliberately transmit incorrect responses to the monitoring module and/or to the second monitoring module with the aid of the first computer unit in order to secure the transmission path into the counting register. In this connection, the first computer unit can hold the counting register of the first monitoring module and/or of the second monitoring module, for example, permanently at a counter reading between 0 and 2.

In one preferred embodiment, the first monitoring module switches off the secured line to the second monitoring module via the field bus as soon as the counting register reaches a predetermined value. In particular, the switchoff of the secured line can be initiated via the first monitoring module of the first control unit given a predefined counter reading, for example, a counter reading of 5. For example, 3 to 5 incorrect responses can be sent until the switchoff can take place. In the case of 80 ms to 85 ms (80 ms repetition time+5 ms tolerance), the possible time window can be 240 ms to 425 ms long. The question-response communication between the second monitoring module and the first computer unit can be disrupted by the switchoff of the field bus communication. As a result, the actuator of the component can be deactivated by the second monitoring module, whereby the component can also be switched off. The switchoff can take place purely digitally in this case. For example, the line from the second monitoring module to the actuator of the component can have a control voltage, whereby the actuator is closed. A switchoff of the component can take place, for example, in such a way that the second monitoring module applies a signal at the line, by means of which the control voltage for the actuator is switched off. As a result, the actuator can be opened, whereby the component can be separated from the motor vehicle, whereby the component can no longer be used by the motor vehicle and can therefore be switched off.

In particular, the second monitoring module can switch off the component via the line as soon as the counting register reaches a predetermined value. Preferably, the switchoff of the component via the line can be initiated by the second monitoring module given a predefined counter reading, for example, a counter reading of 5. For example, 3 to 5 incorrect responses can be sent until the switchoff can take place. Given 80 ms to 85 ms (80 ms repetition time+5 ms tolerance), the possible time window can be 240 ms to 425 ms long. A switchoff of the component by the second monitoring module can take place, for example, in such a way that the second monitoring module applies a signal at the line, by means of which the control voltage for the actuator is switched off. As a result, the actuator can be opened, whereby the component can be separated from the motor vehicle, whereby the component can be switched off.

In one preferred embodiment, the component can be put back into operation when the second monitoring module removes the signal, for example, in order to interrupt the control voltage. In this manner, it can be ensured that the component can be used again after the error is eliminated.

In particular, the second control unit is connected to multiple components. In this manner, the second control unit can carry out multiple remote switchings simultaneously. In addition, the question-response communication can be better adapted to the switching requirements of a remote switch.

Preferably, the second control unit comprises a second computer unit, wherein the second computer unit comprises a switching computer unit in order to control multiple lines, in particular hardware lines. In particular, the switching computer unit can operate an existing field bus driver itself. In addition, 8-bit port information can already be contained in the field bus procotol. As a result, the second monitoring module can control multiple hardware lines.

With respect to further features and advantages of the method according to the invention, reference is explicitly made here to the explanations in conjunction with the computer program according to the invention, the system according to the invention, the component according to the invention, and the motor vehicle according to the invention, and to the figures.

The invention also relates to a computer program which carries out the method according to the invention when run on a computer, in particular on an on-board computer of a motor vehicle, or on a plurality of computers of a computer network, in particular in an on-board network of a motor vehicle. In particular, the program code means can be stored on a computer-readable data carrier.

The scope of the invention also includes a data carrier on which a data structure is stored, which data carrier, after having been loaded in a working memory and/or main memory of a computer or on a plurality of computers of a computer network, can carry out the method according to the invention in one of its embodiments.

The scope of the invention also includes a computer program product having program code means stored on a machine-readable carrier, in order to carry out the method according to the invention in one of its embodiments when the program is run on a computer or on a plurality of computers of a computer network.

In this connection, a computer program product is understood to be the program as a marketable product. In principle, said computer program product can be present in any form, for example, on paper or on a computer-readable data carrier and, in particular, can be distributed via a data transmission network.

The scope of the invention also includes a modulated data signal which contains instructions, which can be carried out by a computer system or by a plurality of computers of a computer network, for carrying out the method according to the invention in one of its embodiments. A computer system can be either a standalone computer or also a network of computers, for example, an in-house closed network, or computers which are connected to one another via the Internet. Furthermore, the computer system can be embodied as a client-server constellation, wherein parts of the invention run on the server and other parts run on a client.

With respect to further features and advantages of the computer program according to the invention, reference is explicitly made here to the explanations in conjunction with the method according to the invention, the arrangement according to the invention, the component according to the invention, and the motor vehicle according to the invention, and to the figures.

The invention also relates to an arrangement for monitoring a component, in particular a battery, of a motor vehicle, comprising a first control unit and a second control unit, wherein the arrangement is designed in such a way that a method for monitoring a component can be carried out as described above. Additional components can be, for example, a motor vehicle motor, an on-board computer, or a transmission.

With respect to further features and advantages of the method according to the invention, reference is explicitly made here to the explanations in conjunction with the method according to the invention, the computer program according to the invention, the component according to the invention, and the motor vehicle according to the invention, and to the figures.

The invention also relates to a component, in particular a battery, of a motor vehicle having an arrangement for monitoring the component, wherein the arrangement is designed in such a way that a method can be carried out as described above. Preferably, the component is a battery, in particular a lithium ion battery, or the battery comprises electrochemical cells. In particular, the component can also be a motor vehicle engine, an on-board computer, or a transmission.

With respect to further features and advantages of the method according to the invention, reference is explicitly made here to the explanations in conjunction with the method according to the invention, the computer program according to the invention, the system according to the invention, and the motor vehicle according to the invention, and to the figures.

The invention also relates to a motor vehicle comprising an electric drive motor for driving the motor vehicle and to a battery as described above, which is connected or connectable to the electric drive motor. The battery is not limited to such an intended use, however, but rather can also be used in other electrical systems.

With respect to further features and advantages of the computer program according to the invention, reference is explicitly made here to the explanations in conjunction with the method according to the invention, the computer program according to the invention, the arrangement according to the invention, and the component according to the invention, and to the figures.

BRIEF DESCRIPTION OF THE DRAWINGS

Further advantages and advantageous embodiments of the objects according to the invention are illustrated by the drawings and the examples and are explained in the following description. It should be noted that the drawings and the examples are only descriptive in nature and are not intended to limit the invention in any way. In the drawings:

FIG. 3 shows a schematic illustration of an example of the charging of a battery of a motor vehicle.

DETAILED DESCRIPTION

Figure 1:
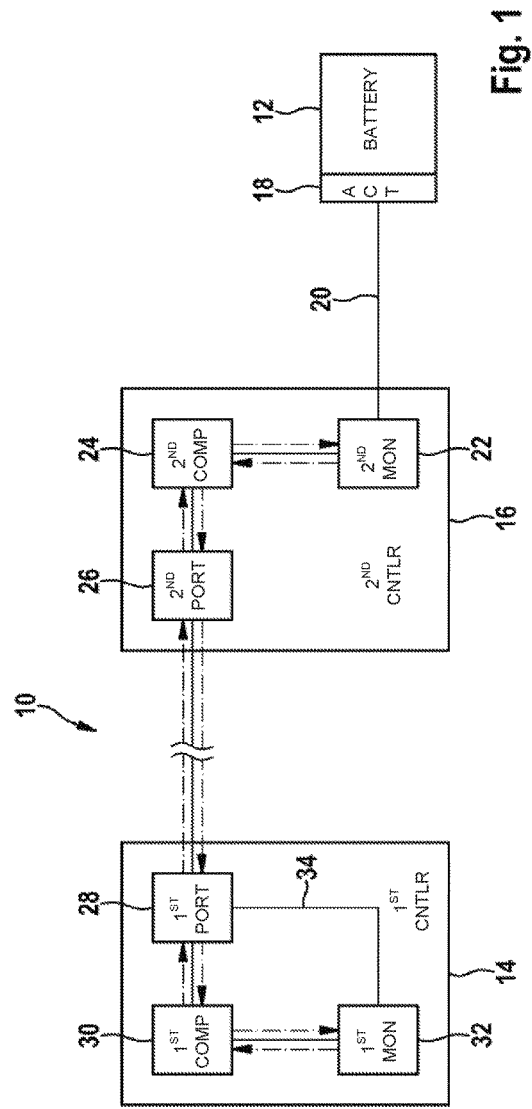
FIG. 1 shows a schematic illustration of a first embodiment, in which the first control unit has an ASIL-X safety classification and the second control unit has a QM safety classification.

FIG. 1 shows an arrangement 10 for monitoring a component 12. The component 12 can be a battery for a motor vehicle. The arrangement comprises a first control unit 14 and a second control unit 16. The first control unit 14 can be a battery control unit BCU, and the second control unit 16 can be the control unit CSC carrying out the switchoff. The component 12 comprises an actuator 18. The actuator 18 of the component 12 is connected to the second monitoring module 22 of the second control unit 16 via a line 20, for example, a hardware line of a cable assembly. The second monitoring module 22 is connected to a second computer unit 24. The second computer unit 24 is connected to a second field bus port 26. The field bus system which is used can be CAN. With the aid of the second field bus port 26, the second control unit 16 can be connected to a first field bus port 28 of the first control unit 14. The first control unit 14 can be located at any point in the motor vehicle. The first field bus port 28 is connected to a first computer unit 30 of the first control unit 14. The first computer unit 30 is connected to a first monitoring module 32. The control device 14 also has a control in the case of a switchoff requirement 34, which control connects the first monitoring module 32 to the field bus port 28 in order to switch off the field bus port 28 if necessary.

The monitoring of the component can take place in the following manner: The second control unit 16 transmits operating data in the form of a randomly generated question from the second monitoring module 22 to the second computer unit 24. The transmission is indicated as a dashed arrow.

The second computer unit 24 establishes a secured digital line to the first computer unit 30 with the aid of the field bus ports 26, 28. The second computer unit 24 also transmits the operating data to the first computer unit 30. This is indicated as a dashed arrow. The first monitoring module 32 and the second monitoring module 22 each transmit operating data to the first computer unit 30 in a defined cycle time, for example, once every 80 ms. The first computer unit 30 must respond to the question in a clearly defined time window, for example, once every 5 ms. In this case, the first computer unit 30 sends data which contain the response to the question to the first monitoring module 32 and/or, with the aid of the field bus ports 26, 28 and the second computer unit 24, to the second monitoring module 22. This is indicated as a dashed arrow. If the data containing the response arrive, for example, incompletely, incorrectly, too late, or not at all, the first monitoring module 32 and/or the second monitoring module 22 begin incrementing a counting register. As soon as the counting register of the first monitoring module 32 and/or of the second monitoring module has reached a previously defined threshold value, for example, a counter reading of 5, the first monitoring module 32 will transmit a signal via the control in the case of a switchoff requirement 34 and/or the second monitoring module 22 will transmit a signal via the line 20, whereby the respectively connected component is influenced, which component is the first field bus port 28 in the case of the first control unit 14 and is the actuator 18 in the case of the second control unit 16. For example, 3 to 5 incorrect responses can be sent until the switchoff takes place. In the case of 80 ms to 85 ms, with a repetition time of 80 ms and a tolerance of 5 ms, a possible time window of 240 ms to 425 ms therefore results. This influencing is purely digital in this case. The first monitoring module 32 and the second monitoring module 22 release the use of a component in that a control voltage is applied at the control in the case of a switchoff requirement 34 and/or at the line 20. For example, the actuator 18 must be closed in order for the component 12 to function. Conversely, the actuator 18 is opened immediately, as soon as the second monitoring module 22 removes its control voltage due to an interference. As a result, the component can no longer be used by the motor vehicle. If a response is correct, the counting register is decremented again, down to a counter reading of 0. The first computer unit 30 holds the counting register of the first monitoring module 32 and/or of the second monitoring module 22 permanently at a counter reading between 0 and 2. Incorrect responses are deliberately inserted by the first computer unit 30 in order to secure the transmission path into the counting register. The present counter reading of the first monitoring module 32 and/or of the second monitoring module 22 is always transmitted to the first computer unit 30 together with the operating data.

The first computer unit 30 and the second computer unit 24 are each responsible for the actual functionality of the component 12. In this case, the computer unit 30 is the main computer, which also contains the complete logic. The first monitoring module 32 and the second monitoring module 22 therefore communicate only with the first computer unit 30. The computer unit 24, on the other hand, is only responsible for carrying out the commands from the computer unit 30. Therefore, all questions of the first monitoring module 32 and of the second monitoring module 22 are also answered exclusively by the computer unit 30. The second computer unit 24 is incapable of generating correct responses on its own. The computer unit 24 receives the generated response from the first computer unit 30 more frequently than the cycle time of the second monitoring module 22. The generated response is temporarily stored in the second computer unit 24 until the cycle time requested by the transmission module 22 is reached and then forwards the response. For example, the second computer unit 24 and the first computer unit 30 can operate in a 10 ms signaling pattern. This means that the second computer unit 24 receives the same response at least 6 times before the response is forwarded to the second monitoring module 22. As a result, independence from the field bus communication can be achieved, and it can be ensured that the system is robustly designed with respect to field bus interferences. The reason for the second monitoring module 22, on the one hand, is that it is now ensured that the communication between the first computer unit 30 and the second computer unit 24 functions without error, and, on the other hand, in the event of an interference of the communication between the first computer unit 30 and the second computer unit 24, the component 12 is separated from the motor vehicle via the actuator 18. Without the second monitoring module 22, all protocols and data in the first computer unit 30 and the second computer unit 24 would be secured. This securing of the communication in the event of an interference is now taken over by the monitoring module 22. For example, a switchoff of the component 12 can be carried out by the first monitoring module 32 in that the first monitoring module sends a signal to the control in the case of a switchoff requirement 34, by means of which, for example, a control voltage is removed. As a result, the switchoff of the first field bus port 28 is carried out via the control in the case of a switchoff requirement 34. The control in the case of a switchoff requirement 34 is a WDA line from the first monitoring module 32 to the first field bus port 28, and switches off the field bus port 28 as soon as the counter reading of the counting register of the second monitoring module 22 has reached a certain value. The question-response communication between the second monitoring module 22 and the first computer unit 30 is therefore disrupted. As a result, the actuator 18 is deactivated by the second monitoring module 22.

Figure 2:
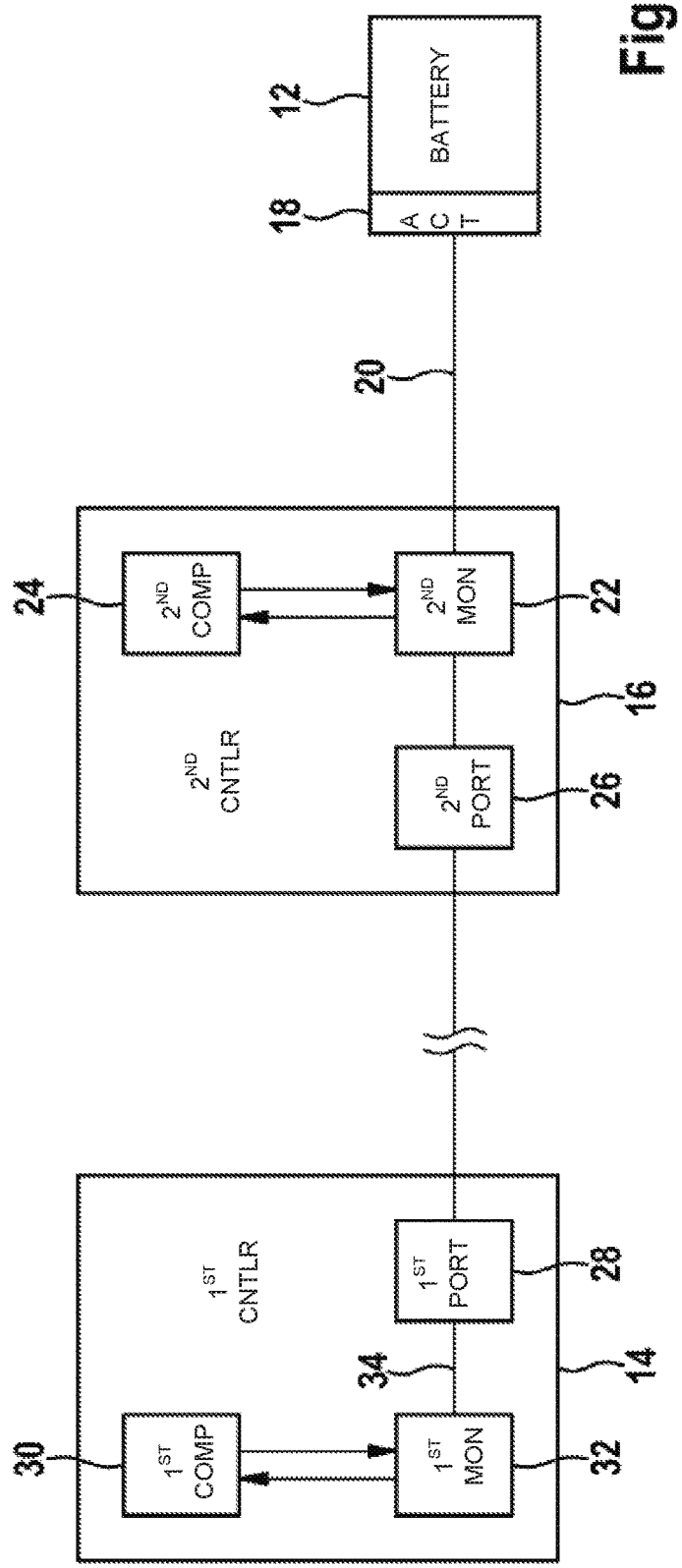
FIG. 2 shows a schematic illustration of a second embodiment, in which the first control unit has an ASIL-X safety classification and the second control unit has an ASIL-X safety classification.

In FIG. 2, as compared to FIG. 1, the second control unit 16 has a safety classification of ASIL-C. The safety-relevant line 20 can be shortened in that the switchoff message is sent to the second computer unit 24 via the field bus.

In FIG. 3, a charging cable 36 of a motor vehicle 38 for a battery 40 is connected to an outlet 42. A first control unit 14 placed in the motor vehicle 38 can request the charge voltage via an external second control unit 16 outside of the motor vehicle 38. In the event of insulation problems, the motor vehicle 38 can be safely removed from the electricity supply grid. Safe charging of the battery 40 can be made possible by means of a two-fold implementation of an ASIL-C standalone remote safety switch by using an internal and an external second control unit 16. In this case, the field bus also implements a type of interlock line which does not apply the voltage to the charging cable 36 until the first control unit 14 is connected to the external second control unit 16. In an application as a safety remote switch, the switchoff can therefore take place over an extensive area in the event of an interference. Safety is increased by means of the reliable switchoff. For example, in the event of a vehicle fire during the charging, the connection to the electricity supply grid can be reliably disconnected, whereby firefighters are supported and protected.

The invention claimed is:

1. A method for monitoring a battery (12) of a motor vehicle having
a first control unit (14) for monitoring the battery (12),
a second control unit (16) for monitoring the battery (12),
wherein the second control unit (16) is disposed at a distance from the first control unit (14) and communicates with the first control unit (14), wherein the second control unit (16) is connected to the battery (12) via a line (20), the method comprising:
transmitting operating data to the first control unit (14) by the second control unit (16),
checking the operating data in the first control unit (14),
transmitting data from the first control unit (14) to the second control unit (16), and
switching off the battery (12) by the second control unit (16) if interference is detected.

2. The method as claimed in claim 1, wherein the first control unit (14) and the second control unit (16) communicate with one another via a field bus.

3. The method as claimed in claim 1, wherein the first control unit (14) has an ASIL-X safety classification and the second control unit (16) has a QM safety classification.

4. The method as claimed in claim 1, wherein the first control unit (14) has an ASIL-X safety classification and the second control unit (16) has an ASIL-X safety classification.

5. The method as claimed in claim 1, wherein the component has an actuator (18) for communicating and switching off the battery (12), wherein the actuator (18) is connected to the second control unit (16) and the actuator (18) is switched off by the second control unit (16) as soon as a communication interruption between the first control unit (14) and the second control unit (16) is detected, whereby the battery (12) is also switched off.

6. The method as claimed in claim 1, wherein the second control unit (16) transmits the operating data to the first control unit (14) within a predetermined time.

7. The method as claimed in claim 1, wherein the first control unit (14) comprises a first computer unit (30) and a first monitoring module (32) and the second control unit (16) comprises a second computer unit (24) and a second monitoring module (22), wherein, via the second computer unit (24), a secured line to the first computer unit (30) is established via a field bus in order to connect the first computer unit (30) to the second monitoring module (22).

8. The method as claimed in claim 7, wherein a counting register which is incremented when erroneous data of the first computer unit (30) are transmitted.

9. The method as claimed in claim 7, wherein the first computer unit (30) deliberately transmits incorrect data to the first monitoring module (32) and/or to the second monitoring module (22).

10. The method as claimed in claim 7, wherein the first monitoring module (32) switches off the secured line to the second monitoring module (22) via the field bus as soon as the counting register reaches a predetermined value.

11. The method as claimed in claim 1, wherein the second control unit (16) is connected to multiple components.

12. The method as claimed in claim 11, wherein the second control unit (16) comprises a second computer unit, wherein the second computer unit comprises a switching computer unit in order to control multiple lines hardware lines.

13. An arrangement for monitoring a battery (12) of a motor vehicle having a first control unit (14) and a second control unit (16), wherein the arrangement is configured such that a method for monitoring the battery (12) is carried out according to a method of claim 1.

14. A component, of a motor vehicle having an arrangement (10) for monitoring the battery (12), wherein the arrangement (10) is designed in such a way that a method as claimed in claim 1 can be carried out.

15. A motor vehicle having an electric drive motor for driving the motor vehicle and having a battery (12), which is a battery, as claimed in 14, which is connected or connectable to the electric drive motor.

16. The method as claimed in claim 1, wherein the battery (12) is switched off when interference is detected by the first control unit (14).

17. The method as claimed in claim 1, wherein the battery (12) is switched off when interference is detected by the second control unit (16).

18. The method as claimed in claim 2, wherein the field bus is a CAN bus or a FlexRay bus.

19. The method as claimed in claim 8, wherein the first monitoring module (32) comprises the counting register.

20. The method as claimed in claim 8, wherein the second monitoring module (22) comprises the counting register.

* * * * *